United States Patent
Yamada

(10) Patent No.: US 7,079,183 B1
(45) Date of Patent: Jul. 18, 2006

(54) CHARGE TRANSFER DEVICE FOR INCREASING DATA RATE AND REDUCING POWER CONSUMPTION

(75) Inventor: Tetsuo Yamada, Kurokawa-gun (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 901 days.

(21) Appl. No.: 09/680,963

(22) Filed: Oct. 6, 2000

(30) Foreign Application Priority Data

Oct. 7, 1999 (JP) ............................ 11-287338
Sep. 21, 2000 (JP) ............................ 2000-287486

(51) Int. Cl.
H04N 5/335 (2006.01)

(52) U.S. Cl. .................... 348/294; 348/303; 348/312
(58) Field of Classification Search ............... 348/294, 348/312, 303
See application file for complete search history.

(56) References Cited

U.S. PATENT DOCUMENTS 5,317,455 A * 5/1994 Kozuki et al. ............... 386/119
6,075,565 A * 6/2000 Tanaka et al. ............... 348/312
6,130,420 A 10/2000 Tanaka et al.
6,211,507 B1 * 4/2001 Kawai ....................... 250/208.1
6,583,818 B1 6/2003 Toma
2002/0118291 A1 * 8/2002 Ishigami et al. ............. 348/311

FOREIGN PATENT DOCUMENTS

| EP | 0 668 691 A1 | 2/1995 |
| EP | 0 668 691 A1 * | 9/1995 |
| JP | 11-164206 | 1/1997 |
| JP | 10-304250 | 11/1998 |
| JP | 11-122535 | 4/1999 |
| JP | 11-164206 | 6/1999 |

* cited by examiner

Primary Examiner—Mehrdad Dastouri
Assistant Examiner—Heather R. Jones
(74) Attorney, Agent, or Firm—Arent Fox PLLC

(57) ABSTRACT

A charge transfer device having: a semiconductor substrate; a charge transfer path formed in the semiconductor substrate and made of a first conductivity type semiconductor layer; a plurality of charge transfer electrodes formed near above the charge transfer path; and a first pulse signal generator circuit for applying either a first pulse signal train for n-phase (n being an integer larger than 1) driving of charges in the charge transfer path to the charge transfer electrodes or a second pulse signal train for (n+1)-phase driving of charges in the charge transfer path to the charge transfer electrodes.

9 Claims, 17 Drawing Sheets

CHARGE TRANSFER DEVICE FOR INCREASING DATA RATE AND REDUCING POWER CONSUMPTION

This application is based on Japanese Patent Application HEI 11-287338, filed on Oct. 7, 1999, and Japanese Patent Application 2000-287486, filed on Sep. 21, 2000 the entire contents of which are incorporated herein by reference.

BACKGROUND OF THE INVENTION a) Field of the Invention

The present invention relates to a charge transfer device, a solid state image pickup device, and a control method for a solid state image pickup device.

b) Description of the Related Art

FIGS. 15A and 15B show an example of a general charge transfer device. FIG. 15A is a plan view and FIG. 15B is a schematic cross sectional view.

As shown in FIG. 15B, a charge transfer device X has: a semiconductor substrate 101 having a principal surface layer of a p-type or an i-type; an n-type semiconductor layer 105 formed on the surface of the semiconductor substrate 101; charge transfer electrodes 121 of polysilicon formed on an insulating film 115 on the n-type semiconductor layer 105; and a pulse signal generator 125 for applying pulse voltages to the charge transfer electrodes.

The charge transfer electrodes 121 include first charge transfer electrodes 121-1, 121-3, 121-5, . . . made of first layer polysilicon and second charge transfer electrodes 121-2, 121-4, 121-6, . . . made of second layer polysilicon. The first and second charge transfer electrodes are disposed alternately in a horizontal direction.

The regions of the n-type semiconductor layer 105 under the first charge transfer electrodes 121-1, 121-3, 121-5, . . . made of the first layer polysilicon have a low n-type impurity concentration, forming potential barriers (B). The regions of the n-type semiconductor layer 105 under the second charge transfer electrodes 121-2, 121-4, 121-6, . . . made of the second layer polysilicon have a high n-type impurity concentration, forming potential wells (W).

First and second two charge transfer electrodes 121 adjacent to each other in the horizontal direction, e.g., the first and second charge transfer electrodes 121-1 and 121-2, or 121-3 and 121-4, are connected in common. A pulse signal Φ2 is applied from the pulse signal generator 125 to the commonly connected charge transfer electrodes 121-1 and 121-2. A pulse signal Φ1 is applied from the pulse signal generator 125 to the commonly connected charge transfer electrodes 121-3 and 121-4.

Similarly, pairs of first and second two adjacent charge transfer electrodes disposed alternately in the horizontal direction are alternately applied with pulse signals Φ2, Φ1, Φ2, Φ1, . . . from the pulse signal generator 125.

FIG. 16 shows the waveforms of pulse signals generated from the pulse signal generator 125 (FIG. 15B).

The pulse signal Φ1 has a waveform with a low level and a high level being set alternately. The pulse signal Φ2 has a waveform opposite in phase to the pulse signal Φ1.

As the pulse signals Φ1 and Φ2 are applied to the charge transfer device X shown in FIGS. 15A and 15B, charges are transferred in the horizontal direction by a two-phase drive method as shown in FIG. 15B.

In addition to the two-phase drive method, charges may be transferred by a three-phase drive method, a four-phase drive method or the like.

In the charge transfer device of a two-phase drive type, a pair of first and second two charge transfer electrodes 121 constitutes one charge transfer stage. In the charge transfer device of the two-phase drive type described above, each charge transfer stage is fixed.

FIG. 17 is a plan view showing a solid state image pickup device A using the charge transfer device X shown in FIGS. 15A and 15B.

The solid state image pickup device A shown in FIG. 17 has: a plurality of photoelectric conversion elements 103 disposed regularly on a two-dimensional plane of the surface of a semiconductor substrate 101; a plurality of vertical charger transfer paths 105 for reading signal charges accumulated in the photoelectric conversion elements 103 and sequentially transferring the read charges in a column direction; a horizontal charge transfer path 107 connected to one ends of the vertical charge transfer paths 105 for transferring charges transferred from the vertical charge transfer paths 105 in the horizontal direction; and an output amplifier 111 for amplifying the charges transferred from the horizontal charge transfer path 107 and outputting the amplified charges.

A read gate 103a is formed between the photoelectric conversion element 103 and vertical charge transfer path 105 to read charges accumulated in the photoelectric conversion element 103 to the vertical charge transfer path 105. Charges are transferred in the vertical charge transfer path 105 toward the horizontal charge transfer path 107.

The charge transfer device X is used as the horizontal charge transfer path 107.

One end of the vertical charge transfer path 105 is connected to the high concentration n-type semiconductor layer 105a forming a well layer in the horizontal charge transfer path 107.

The two-phase drive type charge transfer device described above is driven by two-phase drive pulses. Conventional three-phase or four-phase drive type charge transfer devices not using barrier layers and well layers transfer charges by three-phase or four-phase drive pulses, and cannot transfer charges by different methods.

For example, in the two-phase drive type charge transfer device, two charge transfer electrodes constitute one charge transfer stage and a geometrical length of one charge transfer stage is fixed. Such constriction poses some problem when the charge transfer device is used as the horizontal charge transfer path of a solid state image pickup device. Specifically, in a solid state image pickup device, one charge transfer stage of the horizontal charge transfer path is provided for each vertical charge transfer path in order to transfer all image signals from the vertical charge transfer paths to the horizontal charge transfer path.

In an image monitor mode, it is desired to reproduce an image at high speed by thinning the number of read pixels. It is also desired to thin the numbers of both rows and columns. In this case, if signal charges (electrons) are transferred only in even columns, signal charges are stored in the transfer stages of every second even columns, and charges are not stored in the transfer stages in odd columns adjacent in the horizontal direction so that the transfer stages are empty. This horizontal charge transfer path processes both an image signal and an empty signal, and transfers even an empty charge as a signal.

Therefore, even if the number of signal bits is reduced, a substantial data rate of the horizontal charge transfer path of a solid state image pickup device does not lower nor a consumption power reduces.

SUMMARY OF THE INVENTION

It is an object of the present invention to provide a solid image pickup device using a charge transfer device which can raise a data rate and reduce a consumption power by changing the number of charge transfer stages with the number of signal bits.

According to one aspect of the present invention, there is provided a charge transfer device comprising: a semiconductor substrate; a charge transfer path formed in the semiconductor substrate and made of a first conductivity type semiconductor layer; a plurality of charge transfer electrodes formed near above the charge transfer path; and a first pulse signal generator circuit for applying either a first pulse signal train for n-phase (n being an integer larger than 1) driving of charges in the charge transfer path to the charge transfer electrodes or a second pulse signal train for (n+1)-phase driving of charges in the charge transfer path to the charge transfer electrodes.

According to another aspect of the present invention, there is provided a method of reading a solid state image pickup device, the solid state image pickup device including: a semiconductor substrate; a plurality of photoelectric conversion elements regularly disposed in row and column directions on the semiconductor substrate; a plurality of vertical charge transfer paths extending in a vertical direction and each disposed adjacent to each of a plurality of photoelectric conversion element columns regularly disposed in the column direction; a read gate formed between each photoelectric conversion element and a corresponding vertical charge transfer path for transferring charges accumulated in the photoelectric conversion element to the vertical charge transfer path; a horizontal charge transfer path formed at one ends of the plurality of vertical charge transfer paths for transferring charges in a horizontal direction; and an output amplifier for amplifying charges transferred by the horizontal charge transfer path and outputting the amplified charges, the horizontal charge transfer path including: a charge transfer path formed in the semiconductor substrate and made of a first conductivity type semiconductor layer, the charge transfer path having first barrier layers having a high potential and second well layers having a low potential, disposed alternately; a plurality of first and second charge transfer electrodes alternately formed near above the first barrier layers and first well layers of the charge transfer path; a plurality of charge transfer electrode pairs each having adjacent first and second two charge transfer electrodes connected together; and a third pulse signal generator circuit for applying either a fourth pulse signal train of two-phase for 2-phase driving of charges in the charge transfer path to two charge transfer electrode pairs or a fifth pulse signal train for 2k-phase driving or more of charges in the charge transfer path to the charge transfer electrode pairs, the method comprising: either a step of, when charges accumulated in all photoelectric conversion elements are read, transferring charges in the horizontal charge transfer path by a two-phase drive method; or a step of executing a 1/k horizontal thinning operation by selectively reading charges from photoelectric conversion elements adjacent in the horizontal direction of one column per k columns and transferring charges in the horizontal charge transfer path by a 2k-phase drive method.

As above, a length of one charge transfer stage of a charge transfer device can be changed with the phase of drive pulses.

A monitor image taking operation of an electronic still camera, such as ½, ⅓ and ¼ thinning operations, can be realized without empty charge transfer so that a consumption power can be reduced.

It is possible to raise the data rate and display a monitor image of a high quality with a low consumption power.

A capacity of signal transfer can be increased greatly by a multiple-phase drive method.

DETAILED DESCRIPTION OF THE PREFERRED EMBODIMENTS

A charge transfer device according to the first embodiment of the invention will be described with reference to FIG. 1, FIGS. 2A and 2B and FIG. 3.

Figure 1:
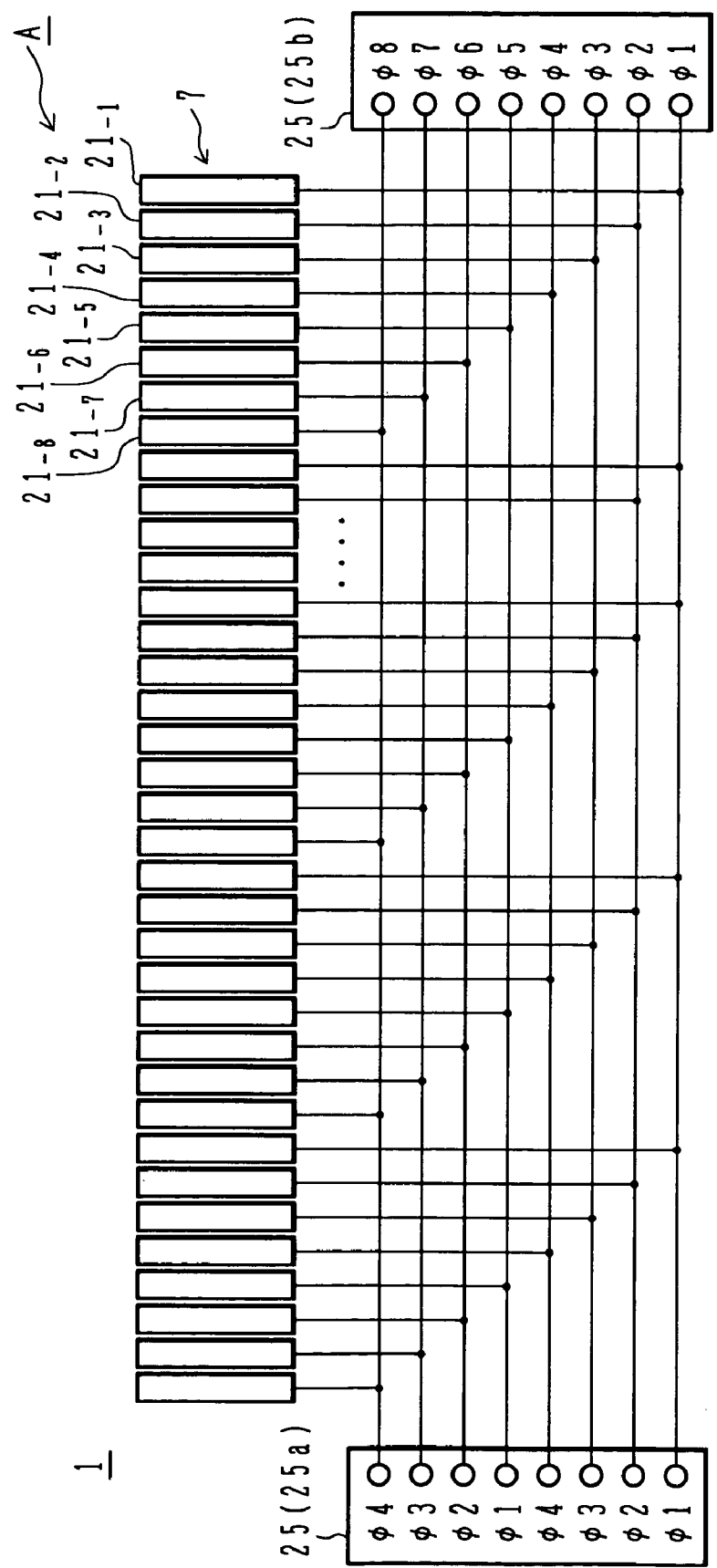
FIG. 1 is a plan view of a charge transfer device according to a first embodiment of the invention.
Figure 2:
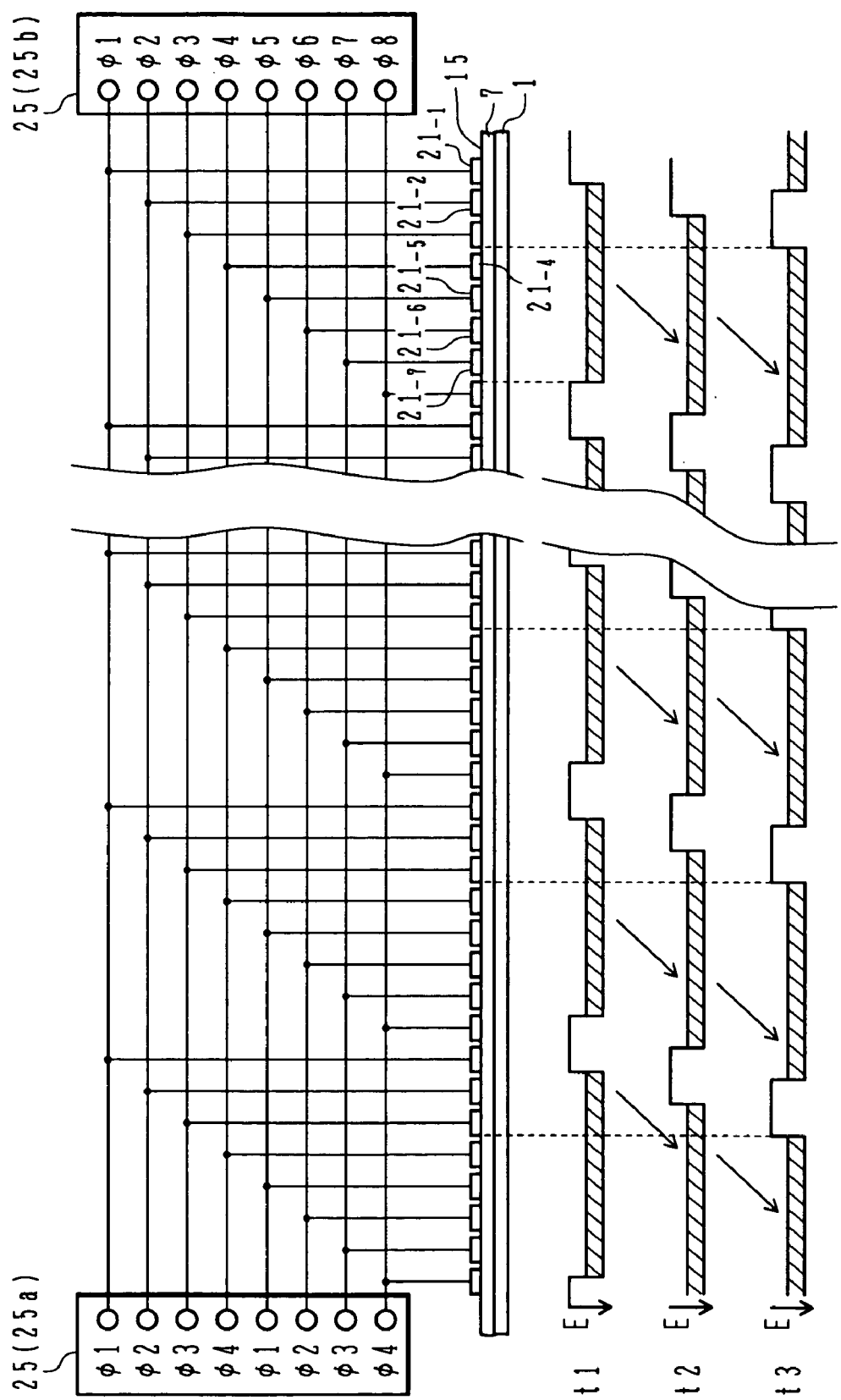
FIG. 2 shows a cross sectional structure of the charge transfer device shown in FIG. 1, with illustrations how charges are transferred.
Figure 3:
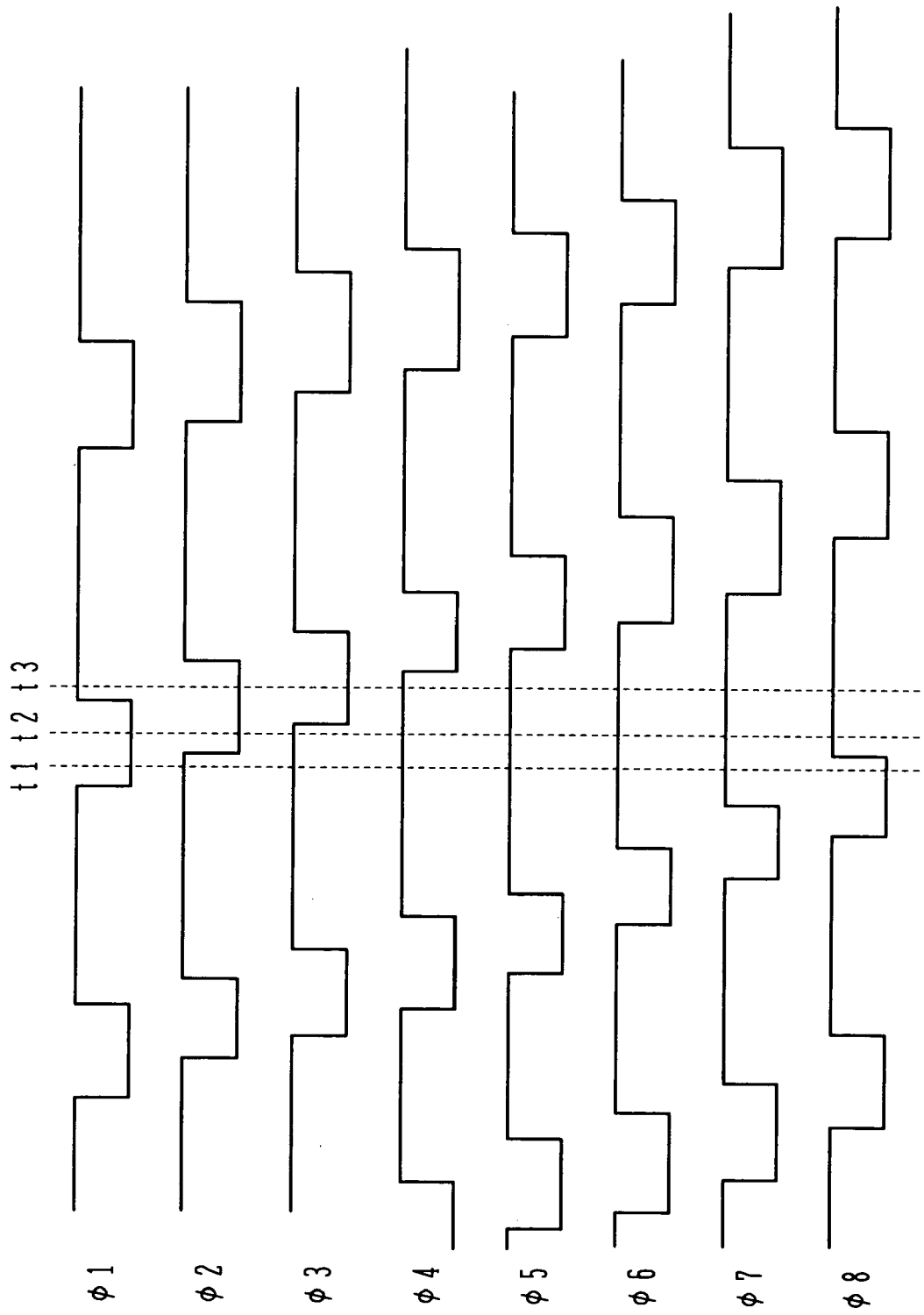
FIG. 3 shows the waveforms of drive pulses applied to horizontal charge transfer electrodes during a charge transfer of the charge transfer device.

FIG. 1 is a plan view of the charge transfer device of the first embodiment, FIG. 2 shows a cross sectional structure of the charge transfer device, with illustrations how charges are transferred. FIG. 3 shows the waveforms of drive pulses.

As shown in FIGS. 1, 2, a charge transfer device A has: a semiconductor substrate 1; a first conductivity type (n-type) semiconductor layer 7 formed on the surface of the semiconductor substrate 1; charge transfer electrodes 21 of polysilicon formed on an insulating film 15 on the semiconductor layer 7; and pulse signal generators 25 (25a, 25b) for applying pulse voltages to the charge transfer electrodes.

The charge transfer electrodes 21 include generally first charge transfer electrodes 21-1, 21-3, 21-5, . . . made of first layer polysilicon and second charge transfer electrodes 21-2, 21-4, 21-6, . . . made of second layer polysilicon. The first and second charge transfer electrodes are disposed alternately in a horizontal direction.

The n-type semiconductor layer 7 has an approximately uniform thickness, forming impurity doped regions.

Eight charge transfer electrodes 21 adjacent to each other in the horizontal direction, e.g., the electrodes 21-1 to 21-8, form one charge transfer electrode group G1.

A pulse signal Φ1 is applied from the pulse signal generator 25 (25a) to the charge transfer electrode 21-1. A pulse signal Φ2 is applied from the pulse signal generator 25 (25a) to the charge transfer electrode 21-2 adjacent to the charge transfer electrode 21-1. A pulse signal Φ3 is applied from the pulse signal generator 25 (25a) to the charge transfer electrode 21-3 adjacent to the charge transfer electrode 21-2. A pulse signal Φ4 is applied from the pulse signal generator 25 (25a) to the charge transfer electrode 21-4 adjacent to the charge transfer electrode 21-3.

Similarly, the pulse signals Φ1 to Φ4 are applied to the adjacent charge transfer electrodes 21-5 to 21-8.

The pulse signals Φ1 to Φ4 are called a first pulse signal train.

Different pulse signals Φ1 to Φ8 are applied from the pulse signal generator 25 (25b) to the same charge transfer electrodes 21 of the charge transfer electrode group G1.

The pulse signals Φ1 to Φ8 are called a second pulse signal train.

As the first pulse signal train (four-phase drive pulses) is applied to the transfer electrodes 21 of the charge transfer device A, charges in the charge transfer device are transferred by a four-phase drive method.

In addition to the four-phase drive method, an n-phase (n is an integer larger than 2) drive method such as a two-phase or a three-phase drive method may be used.

As the second pulse signal train (eight-phase drive pulses) is applied to the transfer electrodes 21 of the charge transfer device A, charges in the charge transfer device are transferred by an eight-phase drive method.

The length of a charge transfer stage for the eight-phase drive method by applying the second pulse signal train is two times that for the four-phase drive method by applying the first pulse signal train. As applying the first pulse signal train, the length of a charge transfer stage for an n-phase drive method (n is a positive integer) is n/4 times that for the four-phase drive method.

In addition to the eight-phase drive method, an (n+1)-phase or (n×m)-phase drive method may be used (m is an integer larger than 1).

FIG. 3 shows the voltage waveforms of the second pulse signal train generated by the pulse signal generator 25.

The drive pulses Φ1 to Φ8 rise from the low level to the high level and fall from the high level to the low level, in the sequential order of Φ1 to Φ8, as seen along the abscissa (time) in FIG. 3.

FIG. 2 shows the charge distribution in the charge transfer device A at times t1, t2 and t3 shown in FIG. 3. Charge signals transferred from the vertical charge transfer paths are transferred in the horizontal direction sequentially from time t1 to time t3. As compared to a conventional two-phase charge transfer, a ratio of empty charge transfer stages to total stages is low. The charge transfer efficiency is therefore improved. Since eight charge transfer electrodes are driven during one period, a charge transfer is speeded up.

The pulse signal generators for generating the first and second pulse signal trains may be formed in the same circuit or in separate circuits. The pulse signal generators may be formed in the same semiconductor substrate or in different substrates (chips).

Figure 4:
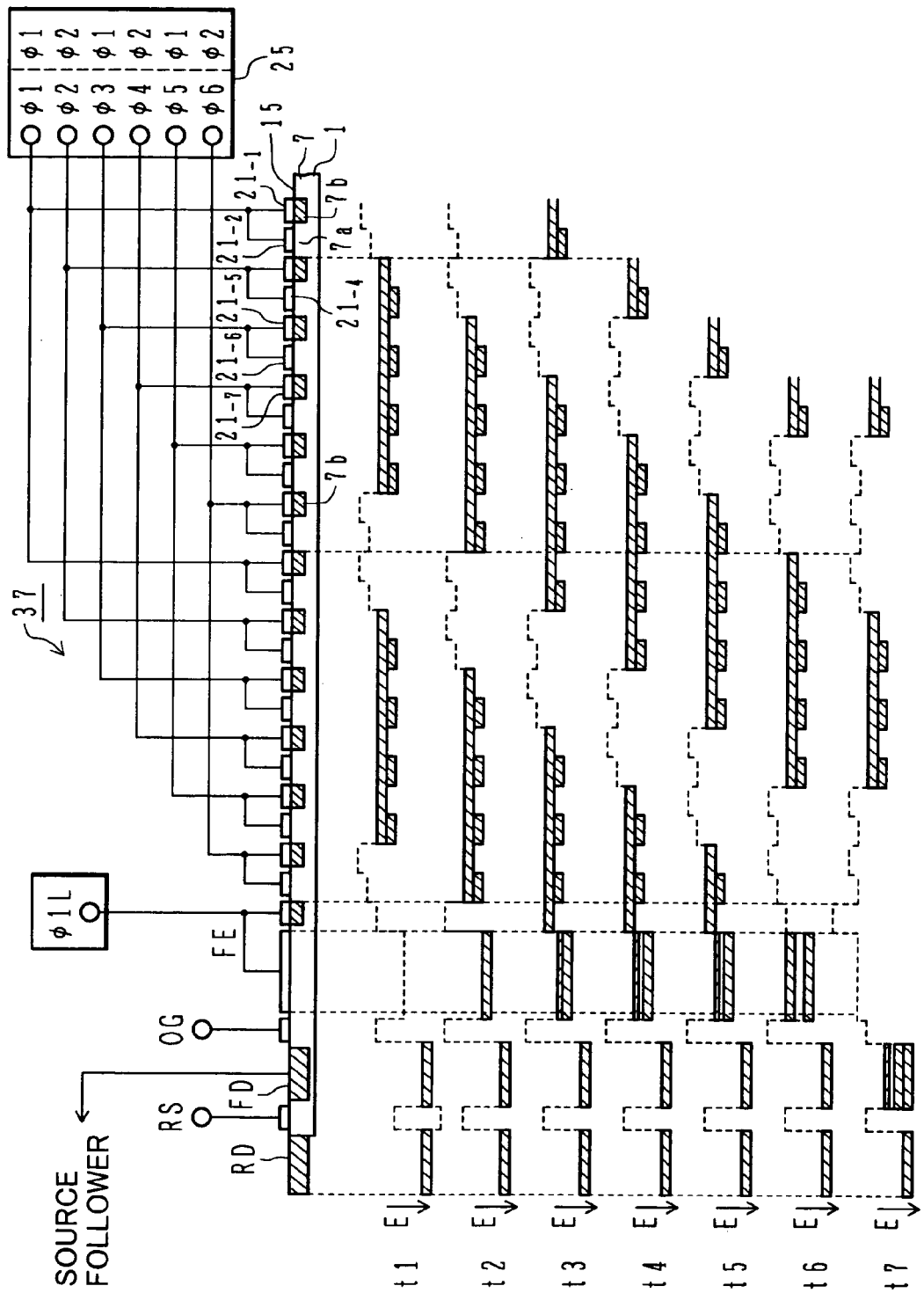
FIG. 4 shows a cross sectional structure of a charge transfer device according to a second embodiment of the invention, with illustrations how charges are transferred.
Figure 5:
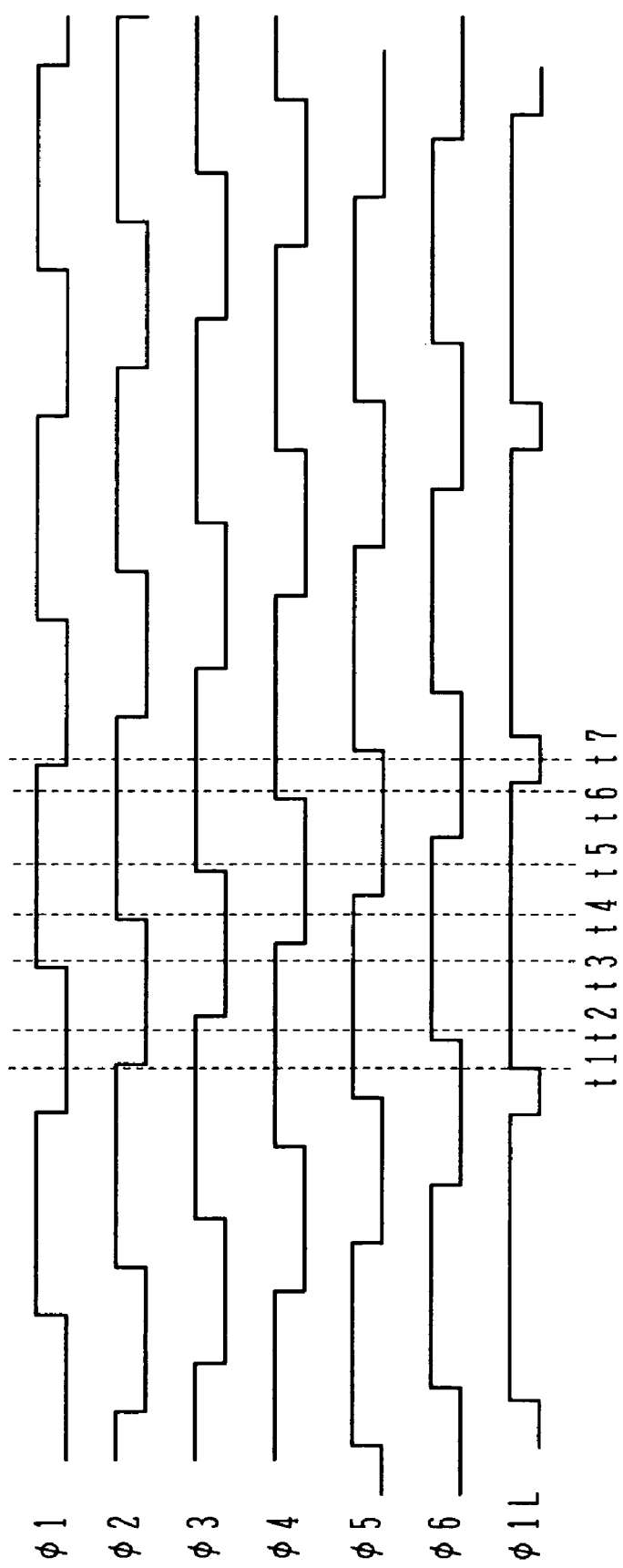
FIG. 5 shows the waveforms of drive pulses applied to horizontal charge transfer electrodes during a charge transfer of the charge transfer device of the second embodiment.

FIG. 4 and FIG. 5 show a charge transfer device according to the second embodiment of the invention. FIG. 4 shows the cross sectional structure of the charge transfer device, with an illustration how charges are transferred, and FIG. 5 shows the waveforms of a pulse signal train applied to transfer electrodes.

As shown in FIG. 4, formed on the final output side of a horizontal charge transfer path 37 are a final transfer electrode FE, an output gate OG, a floating diffusion FD region (charge detecting layer), a reset gate RS, and a reset drain RD. The reset gate RS is an electrode used when charges accumulated in the floating diffusion FD region are reset to an initial value. Reset charges are drained to the reset drain RD.

The fundamental structure of the second embodiment is similar to that of the charge transfer device of the first embodiment. A different point of the charge transfer device of the second embodiment is that the final transfer electrode FE is formed adjacent to the final charge transfer stage of the horizontal charge transfer path.

Charges in the horizontal charge transfer path 37 are transferred toward the floating diffusion FD region by a six-phase drive method. A signal Φ1L is applied to the final transfer electrode FE. Charges are stored in a well region (n-type semiconductor layer) under the final transfer electrode FE.

FIG. 5 shows the waveforms of pulse signals applied to charge transfer electrodes.

The pulse signals Φ1 to Φ6 are applied to charge transfer electrodes to transfer signal charges in the horizontal charge transfer path by a six-phase drive method.

As the pulse signal Φ1L takes a high level, charges are stored in a well of a semiconductor region *n-type semiconductor layer) under the final transfer electrode FE, and as the pulse signal Φ1L takes a low level, the stored charges are transferred to the floating diffusion FD region.

FIG. 4 also illustrates how charges are transferred at times t1 to t7 shown in FIG. 5.

At time t1, the drive pulse Φ1L takes a high level voltage. The potential of the semiconductor region (n-type semiconductor layer) under the final transfer electrode FE lowers to form a potential well. The signal Φ1 takes the low level voltage, the signals Φ2 to Φ5 takes a high level voltage, and the signal Φ6 takes the low level voltage. Charges are stored in the semiconductor regions under the horizontal charge transfer electrodes applied with the high level voltage. Since the signal Φ6 takes the low level, a potential barrier is formed in the semiconductor region of the final charge transfer stage of the horizontal charge transfer path. The stored charges are not transferred to the semiconductor region under the final transfer electrode FE.

At time t2, the signal Φ2 takes the low level and the signal Φ6 takes the high level. The potential barrier formed in the semiconductor region of the final charge transfer stage of the horizontal charge transfer path disappears. The charges stored in the final charge transfer stage of the horizontal charge transfer path are therefore transferred to the semiconductor region under the final transfer electrode FE. The transferred charges are stored in the well formed in the semiconductor region.

At time t3; the signal Φ3 takes the low level. Charges in the horizontal charge transfer path are transferred to the semiconductor region under the final transfer electrode FE. The transferred charges are stored in the well formed in the semiconductor region.

At time t4, the signal Φ4 takes the low level. Charges in the horizontal charge transfer path are transferred to the semiconductor region under the final transfer electrode FE. The transferred charges are stored in the well formed in the semiconductor region.

At time t5, the signal Φ5 takes the low level. Similar to the above, charges in the horizontal charge transfer path are transferred to the semiconductor region under the final transfer electrode FE an d stored in the well.

At time t6, the signal Φ6 takes the low level. Similar to the above, charges in the horizontal charge transfer path are transferred to the semiconductor region under the final transfer electrode FE and stored in the well.

At time t7, a high level voltage is applied to the output gate OG, and the signal Φ1L takes the low level. The charges stored in the semiconductor region under the final transfer gate FE are transferred to the floating diffusion FD region because of a raised potential in this semiconductor region.

By repeating the above operations, as the time lapses (from t1 to t6), charges transferred in the horizontal charge transfer path are gradually stored in the well formed in the semiconductor region (n-type semiconductor layer) under the final transfer electrode FE. At time t7, the stored charges are transferred to the floating diffusion FD region at a time.

Although the horizontal charge transfer path 37 is driven by the six-phase drive method, charges are transferred to the charge detecting layer only when the sixth phase drive pulse is applied. Although the output signal waveform has a frequency different from that when charges in the horizontal charge transfer path 37 are transferred by the two-phase drive method, the data rate is equal.

With this method, a signal hold time in the floating diffusion FD region can be prolonged.

The charges temporarily stored in the semiconductor region under the final transfer electrode FE can be transferred to the floating diffusion FD region at a time. Signal detection, output timings and an output period can be set almost arbitrarily, and an output suitable for signal processing can be obtained.

A noise reduction process such as a CDS process (process by a correlation double sampling circuit) can be executed.

Figure 6:
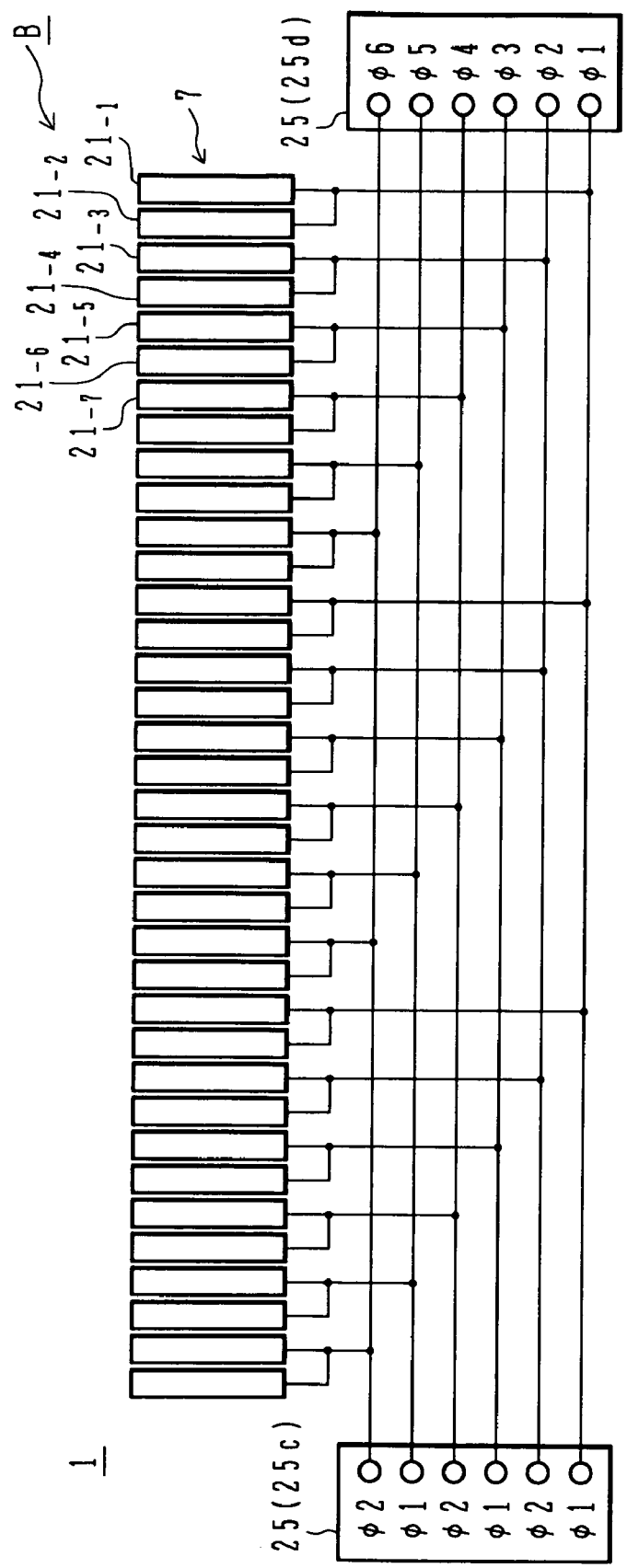
FIG. 6 is a plan view of a charge transfer device according to a third embodiment of the invention.

Next, a charge transfer device according to the third embodiment of the invention will be described with reference to FIG. 6, FIG. 7, and FIG. 8. FIG. 6 is a plan view of the charge transfer device, FIG. 7 shows the cross sectional structure of the charge transfer device, with illustrations how charges are transferred, and FIG. 8 shows the waveforms of drive pulses.

Figure 7:
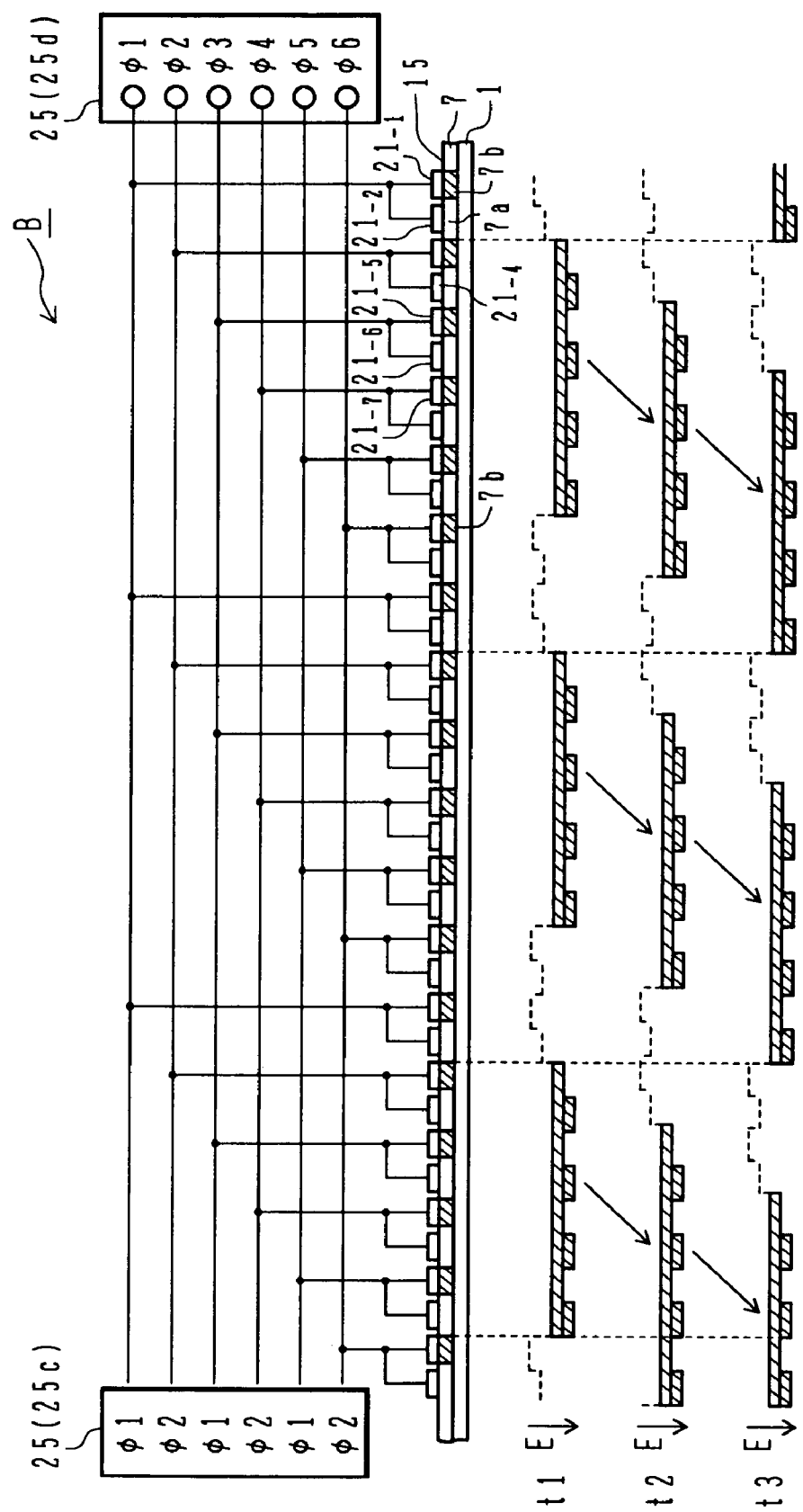
FIG. 7 shows a cross sectional structure of the charge transfer device shown in FIG. 6, with illustrations how charges are transferred.
Figure 8:
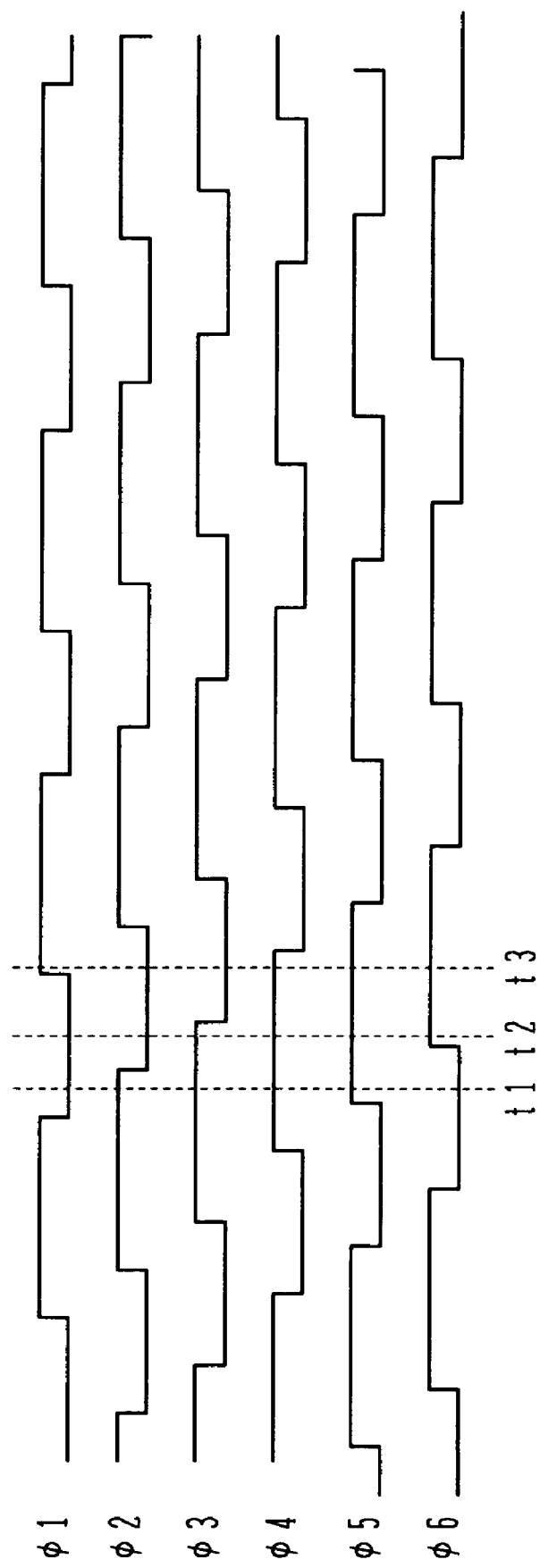
FIG. 8 shows the waveforms of drive pulses applied to horizontal charge transfer electrodes during a charge transfer of the charge transfer device.

As shown in FIG. 6 and FIG. 7, a charge transfer device B has: similar to the charge transfer device A described earlier, a semiconductor substrate 1; an n-type semiconductor layer 7 formed on the surface of the semiconductor substrate 1; charge transfer electrodes 21 of polysilicon formed on an interlayer insulating film 15 on the n-type semiconductor layer 7; and pulse signal generators 25 (25c, 25d) for applying pulse voltages to the charge transfer electrodes.

The charge transfer electrodes 21 include first charge transfer electrodes 21-1, 21-3, 21-5, . . . made of first layer polysilicon and second charge transfer electrodes 21-2, 21-4, 21-6, . . . made of second layer polysilicon. The first and second charge transfer electrodes are disposed alternately in the horizontal direction.

The regions of the n-type semiconductor layer 7 under the first charge transfer electrodes 21-1, 21-3, 21-5, . . . made of the first layer polysilicon have a low n-type impurity concentration, forming potential barriers (B). The regions of the n-type semiconductor layer 7 under the second charge transfer electrodes 21-2, 21-4, 21-6, . . . made of the second layer polysilicon have a high n-type impurity concentration, forming potential wells (W).

First and second two charge transfer electrodes 21 adjacent to each other in the horizontal direction, e.g., the first and second charge transfer electrodes 21-1 and 21-2, or 21-3 and 21-4, are connected in common. A pulse signal Φ2 is applied from the pulse signal generator 25 (25c) to the commonly connected charge transfer electrodes 21-1 and 21-2. A pulse signal Φ1 is applied from the pulse signal generator 25 (25c) to the commonly connected charge transfer electrodes 21-3 and 21-4. The pulse signal Φ2 is applied from the pulse signal generator 25 (25c) to the commonly connected charge transfer electrodes 21-5 and 21-6.

Similarly, pairs of two adjacent charge transfer electrodes disposed alternately in the horizontal direction are alternately applied with pulse signals Φ2, Φ1, Φ2, Φ1, . . . from the pulse signal generator 25 (25c).

The pulse signal generator 25 (25d) independently applies pulse signals Φ1 to Φ6 to the transfer electrodes 21-1 to 21-6.

If the two-phase pulse signals Φ1 and Φ2 are alternately applied to every transfer electrode pair 21 of the charge transfer device B, it operates as a two-phase drive type CCD.

If the six-phase pulse signals Φ1 to Φ6 are alternately applied to every transfer electrode pair 21 of the charge transfer device B, it operates as a six-phase drive type CCD.

The length of the charge transfer stage used by the six-phase drive method is three times that by the two-phase drive method. The length of the charge transfer stage used by the k-phase drive method (k is a positive integer) is k/2 times that by the two-phase drive method.

FIG. 8 shows the waveforms of six-phase pulse signals generated by the pulse signal generator 25 (25d).

The drive pulses Φ1 to Φ6 rise from the low level to the high level and fall from the high level to the low level, in the sequential order of Φ1 to Φ6, as seen along the abscissa (time) in FIG. 8. The period while the pulse signals take the high level is generally equal.

FIG. 7 also shows the charge distribution in the charge transfer device B at times t1, t2 and t3 shown in FIG. 8. Charge signals transferred from the vertical charge transfer paths are transferred in the horizontal direction sequentially from time t1 to time t3. As compared to a conventional two-phase charge transfer, a ratio of empty charge transfer stages to total stages is low. The charge transfer efficiency is therefore improved.

If both the n-phase drive and (n×m)-phase drive methods are to be used, the electric capacity of the second well (semiconductor region under the last transfer electrode FE) is set (n×m−3) times or more that of the first well (well region in the horizontal charge transfer path).

For example, during the time between time t1 and t2, there are three electrodes applied with the low level among the six electrodes. This state can be said that a phase margin of pulse signals is large. Since the three electrodes take the low level, charges are not stored in three wells.

From this reason, a value of (n×m−3) times is appropriate.

A solid state image pickup device according to the fourth embodiment of the invention will be described with reference to FIGS. 9 and 10.

Figure 9:
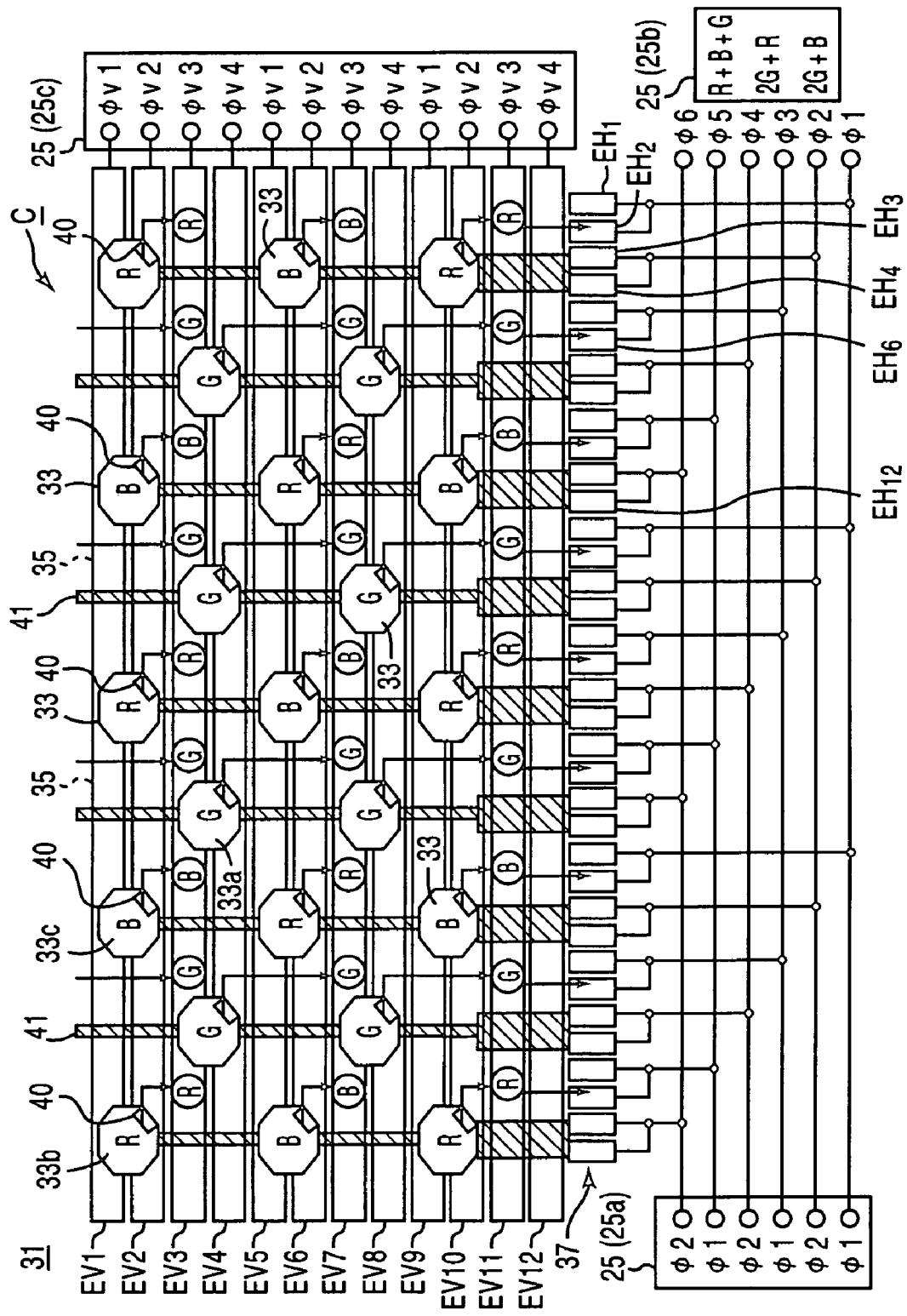
FIG. 9 is a plan view of a solid state image pickup device according to a fourth embodiment of the invention.

As shown in FIG. 9, a solid state image pickup device C according to the fourth embodiment of the invention has: a semiconductor substrate 31; photoelectric conversion elements 33 regularly disposed on the semiconductor substrate 31; vertical charge transfer paths 35 extending in the vertical direction and formed for each set of photoelectric conversion elements 33 regularly disposed in a column direction (vertical direction); a channel stopper 41 extending in the vertical direction and partitioning the vertical charge transfer paths 35 along the horizontal direction; and a horizontal charge transfer path 37 extending in the horizontal direction and connected to one ends of the vertical charge transfer paths 35 in the vertical direction.

The solid type image pickup device C also has: a plurality of vertical charge transfer electrodes EV (EV1, EV2, ..., EV12) extending in the horizontal direction, two electrodes being provided for each row of photoelectric conversion elements 33; horizontal charge transfer electrodes EH (EH1, EH2, EH3, ...) made of first layer polysilicon and second layer polysilicon and formed alternately on the horizontal charge transfer path 37 in the horizontal direction; and read gates 40 each formed between the photoelectric conversion element 33 and vertical charge transfer path 35 for reading charges accumulated in the photoelectric conversion element 33 to the vertical charge transfer path 35.

The solid state image pickup device C has also pulse signal generators 25 (25a, 25b, 25c) for generating pulse signals and applying them to the vertical and horizontal charge transfer electrodes EV and EH.

Two adjacent horizontal charge transfer electrodes EH in the horizontal direction, e.g., the electrodes EH1 and EH2, and EH3 and EH4, are connected in common.

Of the pulse generators 25, the pulse generators 25a and 25b are used for applying pulse signals to the horizontal charge transfer electrodes, whereas the pulse generator 25c is used for applying pulse signals to the vertical charge transfer paths.

The photoelectric conversion elements 33 include green (G) photoelectric conversion elements 33a, red (R) photoelectric conversion elements 33b and blue (B) photoelectric conversion elements 33c.

A plurality of G photoelectric conversion elements regularly disposed in the vertical direction is disposed every second columns.

In a column adjacent in the horizontal direction to the column of G photoelectric conversion elements disposed in the vertical direction, B and R photoelectric conversion elements are alternately disposed shifted by a half pitch of G photoelectric conversion elements. The solid state image pickup device has a so-called pixel-shift layout.

In a row adjacent in the vertical direction to the row of G photoelectric conversion element disposed in the horizontal direction, B and R photoelectric conversion elements are alternately disposed in the horizontal direction.

FIG. 9 illustrates a transfer state of signal charges when they are read from all pixels of the solid state image pickup device having the pixel-shift layout. In this transfer state, charge signals disposed in one row in the order of R, G, R, G, ... are transferred in parallel in the vertical charge transfer paths 35.

If charge signals transferred from photoelectric conversion elements of k columns adjacent in the horizontal direction to the horizontal charge transfer path are to be added and read, the charge signals in the horizontal charge transfer path are driven by a 2k-phase drive method.

After charge signals are transferred to the horizontal charge transfer path 37, six-phase drive pulses are applied from the pulse signal generator 25 (25b) to the horizontal charge transfer electrodes EH. In this case, an addition signal of R+G+B, an addition signal of 2G+R and an addition signal of 2G+B are output at a half of the data rate of the two-phase drive method. These output signals are processed by a signal processing circuit to display a monitor image.

If two-phase signal pulses are applied to the horizontal charge transfer electrodes EH, charges can be read from all pixels similar to the normal operation of a solid state image pickup device.

Figure 10:
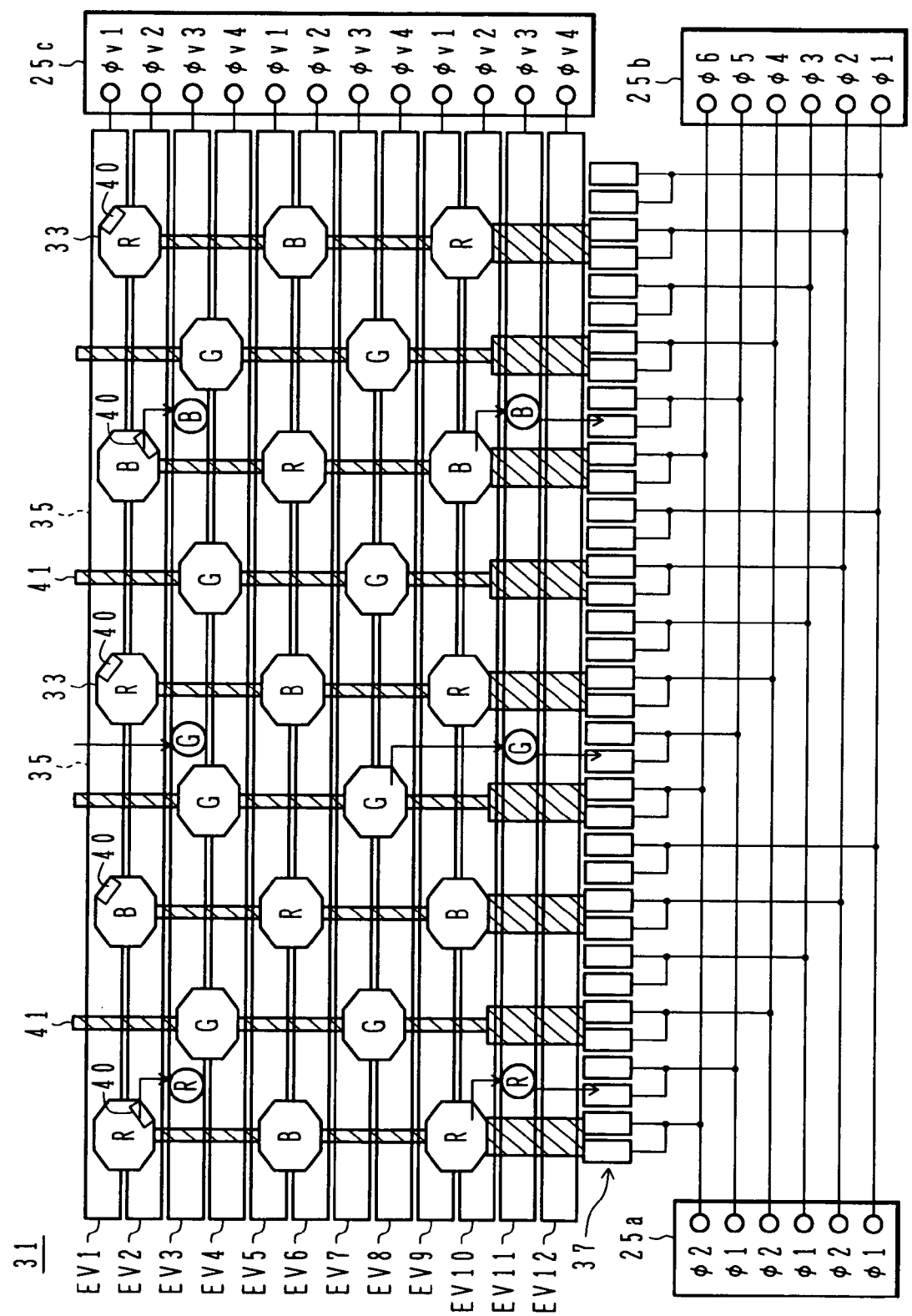
FIG. 10 is a plan view of a solid state image pickup device according to a modification of the fourth embodiment and illustrates a thinning read operation.

FIG. 10 illustrates a control method for a solid state image pickup device according to a modification of the fourth embodiment.

The solid state image pickup device shown in FIG. 10 has the structure similar to that shown in FIG. 9.

When signal charges in the photoelectric conversion element 33 are read to the vertical charge transfer path 35, for example, a pulse signal $\Phi v2$ takes a high positive voltage, e.g., 15 V. Signal charges in the B and R photoelectric conversion elements 33 are read to the vertical charge transfer paths 35.

Signal charges in the vertical charge transfer paths 35 are transferred by a four-phase drive method toward the horizontal charge transfer path by applying pulse signals $\Phi v1$ to $\Phi v4$ to the vertical charge transfer electrodes.

In this modification, the positions of read gates 40 are different between the same color photoelectric conversion elements.

For example, when the read pulse signal $\Phi v2$ is applied, signal charges are read only from specific R and B photoelectric conversion elements in the same row. In this example, the read gates 40 are positioned either on the EV1 or EV2 electrode side corresponding to the pulse signals $\Phi v1$ and $\Phi v2$. Similarly, in other rows, the positions of read gates 40 are different between the same color photoelectric conversion elements. In this manner, a thinning operation in the horizontal direction is possible. In this example shown in FIG. 10, signal charges can be read from the photoelectric conversion elements of one column per three columns by applying the read pulses to the charge transfer electrodes.

If the number of vertical charge transfer electrodes per one row of photoelectric conversion elements is increased, the number n of the 1/n horizontal thinning can be changed flexibly.

For example, if the number of vertical charge transfer electrodes per one row is increased to four and the position of each read gate for each of photoelectric conversion elements on the same row is set to one of the four positions corresponding to the four vertical charge transfer electrodes, then the number n of the 1/n horizontal thinning can be changed depending upon to which vertical charge transfer electrode or electrodes the read pulse is applied.

Further, if control gates are provided between the vertical charge transfer paths and horizontal charge transfer path, the number n of the 1/n horizontal thinning can be changed flexibly. Specifically, the control gates select desired vertical charge transfer paths and signal charges are read only from the selected vertical charge transfer paths. This method is disclosed in U.S. patent application filed on Jun. 7, 2000, the Case Ser. No. 09/588,552. The contents of U.S. patent application filed on June 7 are incorporated herein by reference and are construed as forming part of this specification.

With the control method for the solid image pickup device shown in FIG. 10, by applying read pulses to predetermined charge transfer electrodes, charges can be read from photoelectric conversion elements 33 of one row per four rows (¼ vertical thinning read operation). Signal charges in the vertical charge transfer paths 35 in one column per three columns can be transferred to the horizontal charge transfer path 37 (⅓ horizontal thinning read operation).

The 1/k horizontal thinning is executed by selectively reading signal charges from photoelectric conversion elements of one column per four columns adjacent in the horizontal direction, and then signal charges in the horizontal charge transfer path are driven by the 2k-phase drive method.

As the six-phase pulse signals Φ1 to Φ6 are applied, the horizontal charge transfer path 37 is driven by the six-phase drive method. As the six-phase drive method is used, signal charges transferred from vertical charge transfer paths of one column per three columns can be transferred in the horizontal charge transfer path without an empty signal charge transfer.

With the above operation, signal charges thinned by ⅓ in the horizontal direction can be output. In this example shown in FIG. 10, thinned signal charges are output in the order of R, G, B, G, . . . . This solid state image pickup device can be used effectively for displaying a clear moving monitor image on a digital still camera.

Since signal charges in the horizontal charge transfer path are driven by the six-phase drive method, the data rate lowers and the frequency of drive pulses lowers by ⅓. The consumption power is also reduced by ⅓.

A solid state image pickup device-according to the fifth embodiment of the invention will be described with reference to FIGS. 11 to 14.

Figure 11:
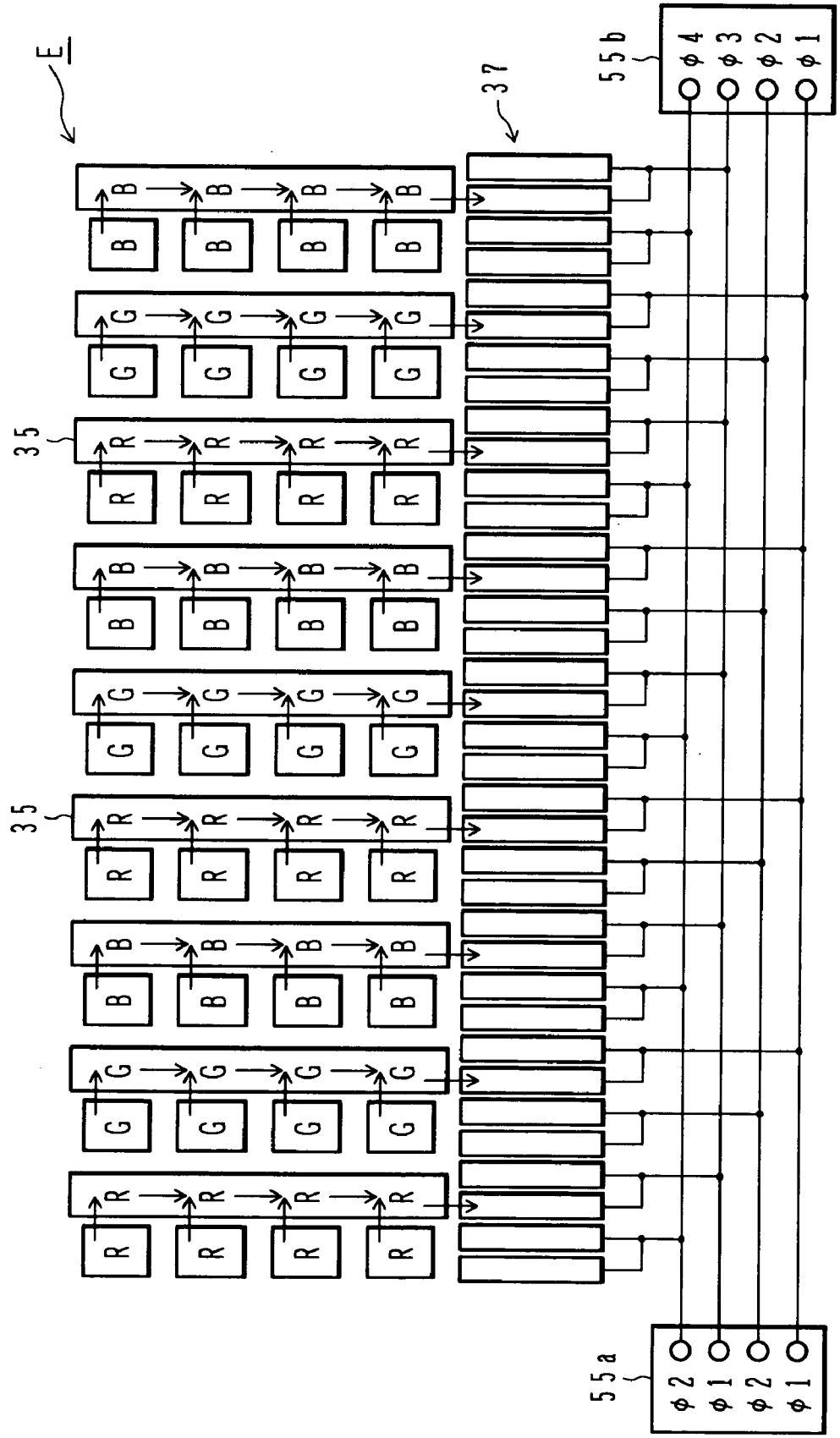
FIG. 11 is a plan view of a solid state image pickup device according to a fifth embodiment of the invention and illustrate a charge read method.
Figure 13:
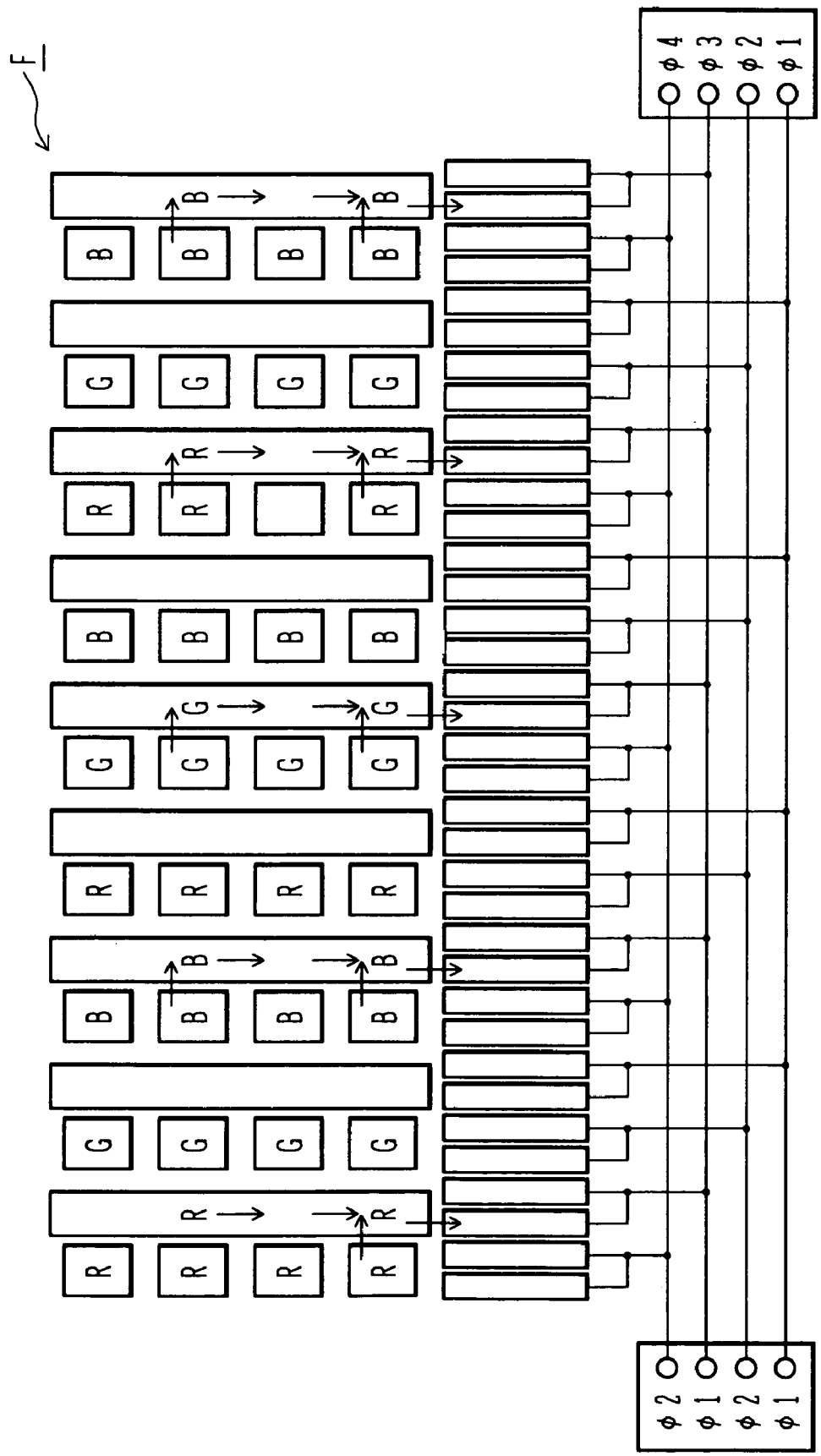
FIG. 13 is a plan view of a solid state image pickup device according to a modification of the fifth embodiment and illustrates a thinning charge read operation.

In the structure of the solid-state image pickup device shown in FIGS. 11 and 13, pulse signals Φ1 to Φ4 are applied to pairs of two horizontal charge transfer electrodes EH.

FIG. 11 illustrates an operation of reading all pixels.

Photoelectric conversion elements 33 have an RGB vertical stripe color filter layout regularly disposing R, G and B photoelectric conversion elements in a vertical direction.

Figure 12:
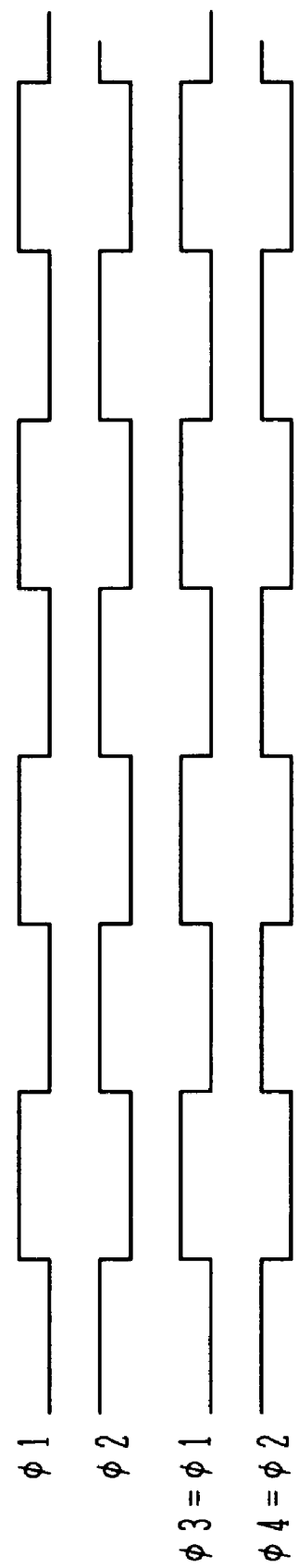
FIG. 12 shows the waveforms of drive pulses applied to horizontal charge transfer electrodes during a charge read operation of the charge transfer device shown in FIG. 11.

FIG. 12 shows the waveforms of drive pulses used for two-phase driving the horizontal charge transfer path 37. The drive pulses Φ1 and Φ3 have the same waveform, and the drive pulses Φ2 and Φ4 have the same waveform. Similar to a charge transfer in a horizontal charge transfer path by the two-phase drive method, signal charges can be read from all photoelectric conversion elements.

The solid state image pickup device shown in FIG. 13 has the same structure as that shown in FIG. 11. FIG. 13 shows the distribution of image signals when a ½ vertical and horizontal thinning read operations are executed. Also by the ½ horizontal thinning read method, an RGB stripe signal is output.

Figure 14:
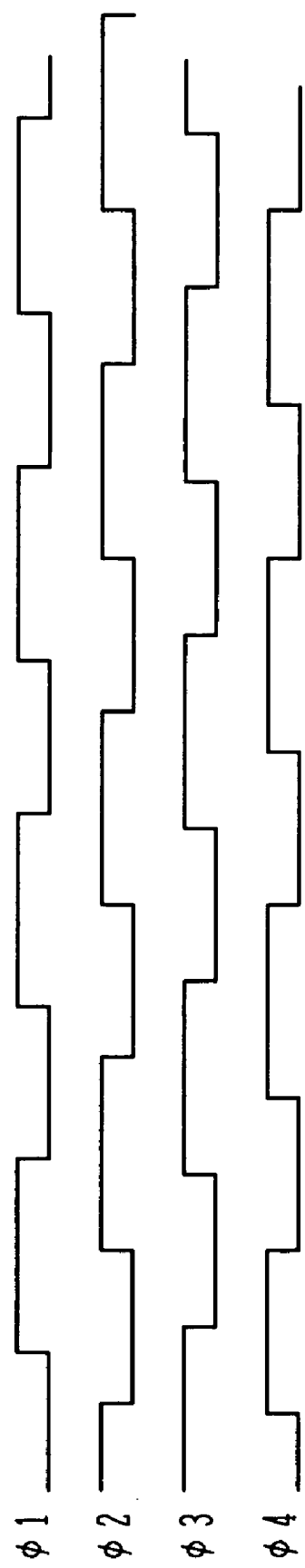
FIG. 14 shows the waveforms of drive pulses applied to horizontal charge transfer electrodes during a charge read operation of the charge transfer device shown in FIG. 13.
Figure 15A:
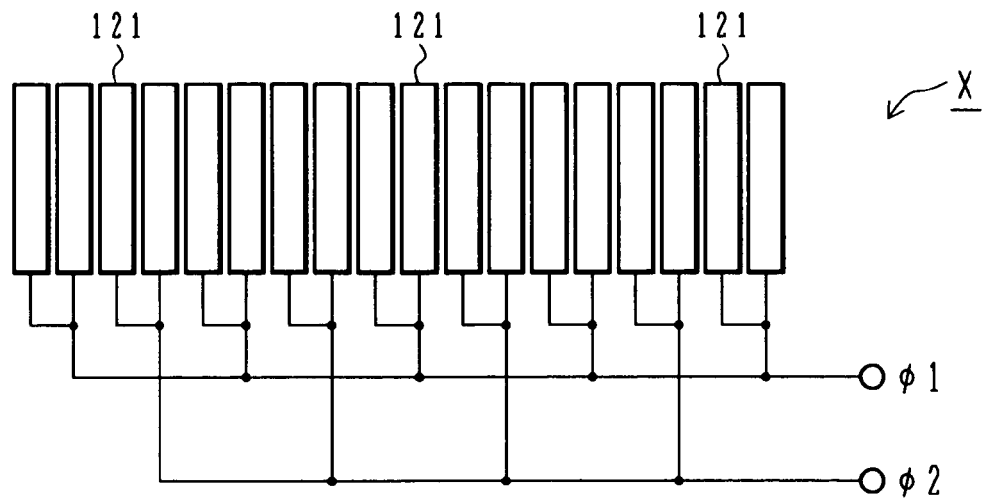
FIG. 15A is a plan view of a conventional two-phase drive type charge transfer device.
Figure 15B:
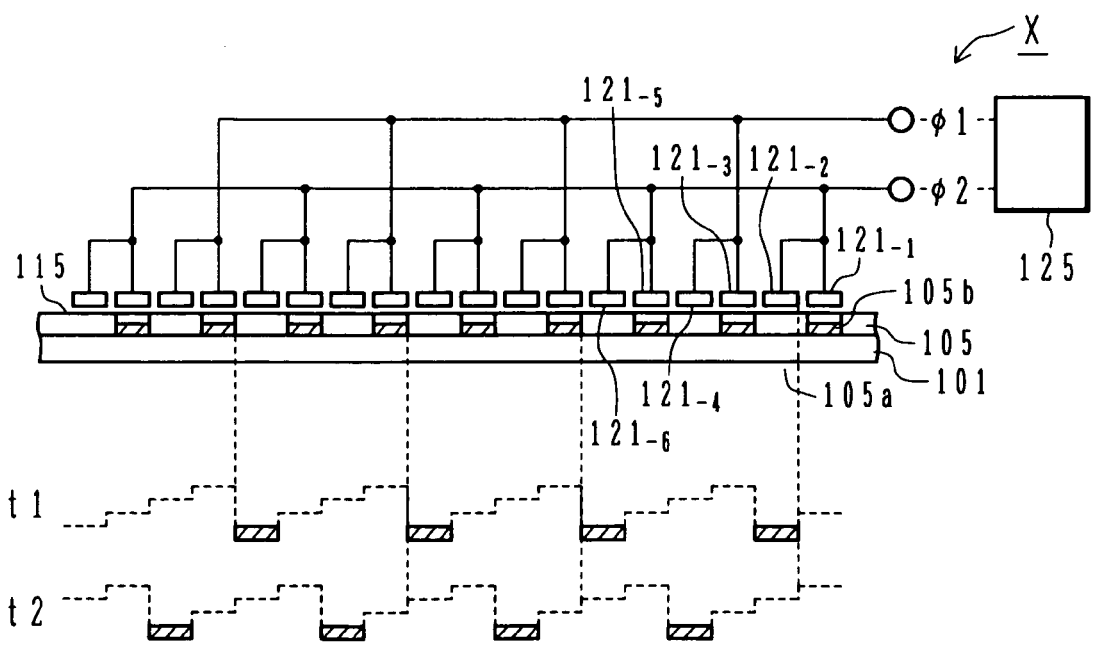
FIG. 15B is a diagram showing the cross section thereof and illustrating how charges are transferred.
Figure 16:
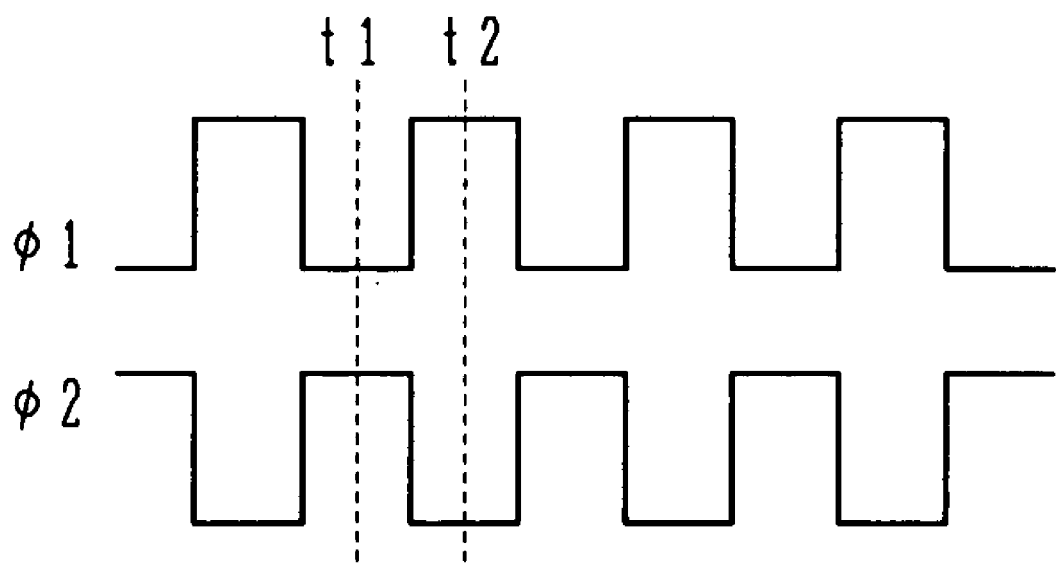
FIG. 16 shows the waveforms of pulse signals applied to a conventional two-phase drive type charge transfer device.
Figure 17:
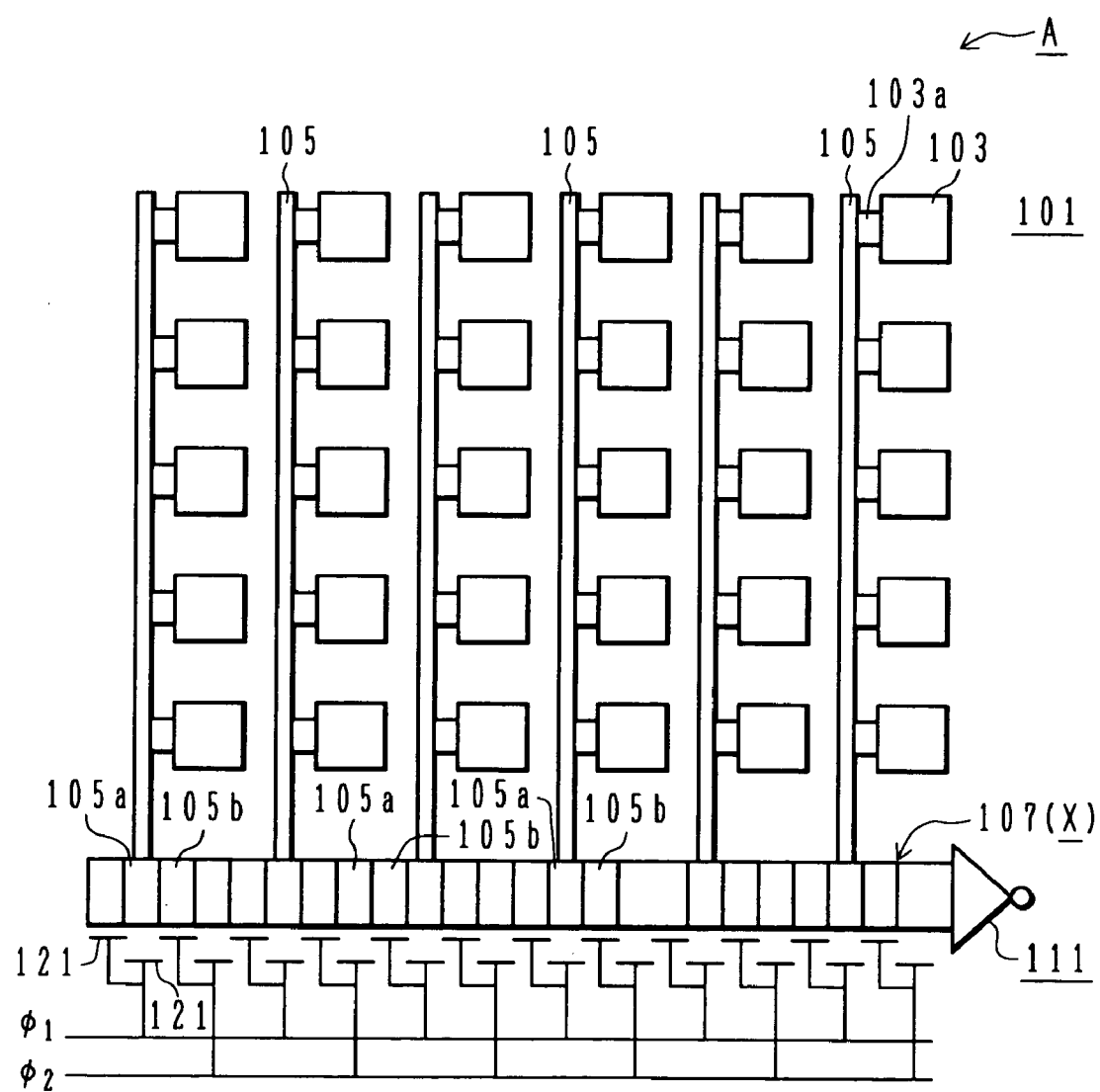
FIG. 17 is a plan view of a conventional solid state image pickup device.

FIG. 14 shows the waveforms of drive pulses applied to the horizontal charge transfer electrodes EH for the ½ vertical and horizontal thinning read operations.

The pulse signals Φ1 to Φ4 rise from the low level to the high level in the sequential order of Φ1 to Φ4 and fall from the high level to the low level in this order.

By applying the four-phase drive pulses to the horizontal charge transfer electrodes EH, the ½ horizontal thinning operation can be executed without an empty charge transfer. The consumption power is reduced by ½.

The shape of a pixel may be a square, a polygon or the like in addition to the regular hexagon.

The present invention has been described in connection with the preferred embodiments. The invention is not limited only to the above embodiments. It is apparent that various modifications, improvements, combinations, and the like can be made by those skilled in the art.

The invention claimed is:

1. A charge transfer device comprising:
    a semiconductor substrate;
    a charge transfer path formed in said semiconductor substrate and made of a first conductivity type semiconductor layer, said charge transfer path having first barrier layers having a high potential and first well layers having a low potential, disposed alternately;
    a plurality of first and second charge transfer electrodes alternately formed near above the first barrier layers and first well layers of said charge transfer path;
    a plurality of charge transfer electrode pairs each having adjacent first and second two charge transfer electrodes connected together;
    a third pulse signal generator circuit for applying either a fourth pulse signal train of two-phase for 2-phase driving of charges in said charge transfer path to two charge transfer electrode pairs or a fifth pulse signal train for 2k-phase driving or more of charges in said charge transfer path to the charge transfer electrode pairs;
    a charge storage region formed adjacent to a final stage of the charge transfer electrodes for temporarily storing charges transferred in said charge transfer path; and
    a charge detecting region for detecting an amount of charges stored in said charge storage region.

2. A charge transfer device according to claim 1, wherein said charge storage region comprises:
    a second barrier layer and a second well layer formed adjacent to each other in said charge transfer path;
    a third charge transfer electrode and a fourth charge transfer electrode formed above the second barrier layer and the second well layer; and
    a stored charge output pulse generator circuit connected to said third charge transfer electrode and said fourth charge transfer electrode, for generating a stored charge output pulse.

3. A charge transfer device according to claim 1, wherein the second well layer has an electric capacity larger than an electric capacity of the first well layer and the channel transfer device further comprises a floating diffusion region formed adjacent to the second well layer for detecting an amount of charges transferred from said charge transfer path.

4. A charge transfer device according to claim 1, further comprising a horizontal charge transfer path and the third pulse signal generator circuit applies either a fourth pulse signal train of two-phase for 2-phase driving of charges in said horizontal charge transfer path or a fifth pulse signal train for 2k-phase driving or more of charges in said horizontal charge transfer path.

5. A charge transfer device comprising:
    a semiconductor substrate;
    a charge transfer path formed in said semiconductor substrate and made of a first conductivity type semiconductor layer;

a plurality of charge transfer electrodes formed near above said charge transfer path; and a first pulse signal generator circuit for applying either a first pulse signal train for n-phase (n being an integer larger than 1) driving of charges in said charge transfer path to said charge transfer electrodes or a second pulse signal train for (n+1)-phase driving of charges in said charge transfer path to said charge transfer electrodes;

a charge storage region formed adjacent to a final stage of the charge transfer electrodes for temporarily storing charges transferred in said charge transfer path; and a charge detecting region for detecting an amount of charges stored in said charge storage region.

6. A charge transfer device according to claim 5, further comprising a horizontal charge transfer path and the first pulse signal generator circuit applies either a first pulse signal train for n-phase (n being an integer larger than 1) driving of charges in said horizontal charge transfer path or a second pulse signal train for (n+1)-phase driving of charges in said horizontal charge transfer path.

7. A charge transfer device comprising:

a semiconductor substrate;

a charge transfer path formed in said semiconductor substrate and made of a first conductivity type semiconductor layer;

a plurality of charge transfer electrodes formed near above said charge transfer path; and a second pulse signal generator circuit for applying either a first pulse signal train for n-phase driving (n being an integer larger than 1) of charges in said charge transfer path to said charge transfer electrodes or a third pulse signal train for (n×m)-phase driving (m being an integer larger than 1) of charges in said charge transfer path to said charge transfer electrodes;

a charge storage region formed adjacent to a final stage of the charge transfer electrodes for temporarily storing charges transferred in said charge transfer path; and a charge detecting region for detecting an amount of charges stored in said charge storage region.

8. A charge transfer device according to claim 7, further comprising a horizontal charge transfer path and the second pulse signal generator circuit applies either a first pulse signal train for n-phase driving (n being an integer larger than 1) of charges in said horizontal charge transfer path or a third pulse signal train for (n×m)-phase driving (m being an integer larger than 1) of charges in said horizontal charge transfer path.

9. A charge transfer device comprising:

a semiconductor substrate;

a charge transfer path formed in said semiconductor substrate and made of a first conductivity type semiconductor layer, said charge transfer path having first barrier layers and second well layers alternately disposed adjacent to each other;

a plurality of charge transfer electrodes formed adjacent to each other above said charge transfer path;

a second pulse signal generator circuit for applying either a first pulse signal train for n-phase driving (n being an integer larger than 1) of charges in said charge transfer path to said charge transfer electrodes or a third pulse signal train for (n×m)-phase driving (m being an integer larger than 1) of charges in said charge transfer path to said charge transfer electrodes;

a charge storage region formed adjacent to a final stage of the charge transfer electrodes for temporarily storing charges transferred in said charge transfer path; and a charge detecting region for detecting an amount of charges stored in said charge storage region, wherein said charge storage region comprises:

a second barrier layer and a second well layer formed adjacent to each other in said charge transfer path;

a third charge transfer electrode and a fourth charge transfer electrode formed above the second barrier layer and the second well layer; and a stored charge output pulse generator circuit connected to said third charge transfer electrode and said fourth charge transfer electrode, for generating a stored charge output pulse, and wherein an electric capacity of the second well layer has an electric capacity by (n×m−3) times or more larger than an electric capacity of the first well.

* * * * *